(12) United States Patent
Muzio et al.

(10) Patent No.: US 6,566,018 B2
(45) Date of Patent: May 20, 2003

(54) DUAL-MEMBER PELLICLE ASSEMBLIES AND METHODS OF USE

(75) Inventors: Edward Muzio, Rio Rancho, NM (US); Jerry C. Cullins, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 78 days.

(21) Appl. No.: 09/840,407

(22) Filed: Apr. 23, 2001

(65) Prior Publication Data

US 2002/0155359 A1 Oct. 24, 2002

(51) Int. Cl.$^7$ .................................................. G03F 9/00
(52) U.S. Cl. ........................................................ 430/5
(58) Field of Search ............................................ 430/5

(56) References Cited

U.S. PATENT DOCUMENTS

| | | | |
|---|---|---|---|
| 4,737,387 A | 4/1988 | Yen | 428/14 |
| 4,833,051 A | 5/1989 | Imamura | 430/5 |
| 5,959,721 A | 9/1999 | Nishi | 355/53 |

*Primary Examiner*—Christopher G. Young
(74) *Attorney, Agent, or Firm*—Schwegman, Lundberg, Woessner & Kluth, P.A.

(57) ABSTRACT

Apparatus and methods to protect a photomask that is used for semiconductor photolithography at wavelengths either within or outside the visible spectrum include a pellicle that is removed during exposure. The pellicle sheet can be transparent or opaque. In one embodiment, a pellicle assembly comprises a base member aligned with a photomask, and an upper member in the form of a pellicle frame coupled to a pellicle sheet. The pellicle frame can be removed from the exposure path. When overlying the base member, the pellicle frame can be secured to it with a securing mechanism such as magnets, mating bevels, or mating male and female members. Detaching and handling elements, such as handles and/or recesses, can be provided to detach the pellicle frame from the base member and/or to move the pellicle assembly. Methods of using a pellicle assembly are also described.

31 Claims, 4 Drawing Sheets

DUAL-MEMBER PELLICLE ASSEMBLIES AND METHODS OF USE

RELATED APPLICATIONS

The present application is related to the following applications which are assigned to the same assignee as the present application:

Ser. No. 09/840,373, filed Apr. 23, 2001, entitled "Hinged Pellicles and Methods of Use"; and Ser. No. 09/840,364, filed Apr. 23, 2001, entitled "Mechanized Retractable Pellicles and Methods of Use".

TECHNICAL FIELD

The present subject matter relates generally to the field of semiconductors and, more particularly, to dual-member pellicle assemblies and methods of use.

BACKGROUND INVENTION

In semiconductor processing, a photolithographic mask (photomask) is used to pattern a radiation sensitive layer on a semiconductor substrate. Typically, the radiation sensitive layer is called a photoresist layer. A "photomask" is defined herein as the combination of a photomask substrate and a patterning material. Typically, the substrate comprises a quartz or glass plate, which is transparent to the exposing radiation, and the patterning material lies on one side of the substrate and typically comprises chrome, aluminum, or gold, which is opaque to the exposing radiation. A stepping field is the portion of the patterning material that is used to pattern the photoresist layer.

The photoresist layer is sensitive to photomask defects, such as particles, for example. If a particle is present on a photomask within the stepping field when a photoresist layer is exposed using the photomask, the particle may cause a corresponding image to be formed in the patterned photoresist layer, which in turn may cause the device being fabricated to fail. If the stepping field of the photomask contains only one die, then all die on the semiconductor substrate may fail.

A pellicle is typically used to reduce the likelihood that particles migrate onto the stepping field of a photomask. A "pellicle" is defined herein to include a pellicle frame and a pellicle membrane or sheet. The pellicle sheet is typically a flat, usually organic material, such as nitrocellulose or cellulose acetate, and it may be coated with one or more layers of fluoropolymers.

FIG. 1 illustrates a perspective view of prior art semiconductor photolithography equipment 1, including a prior art pellicle. The equipment 1 includes an illumination optical system 2, including a source 4 of photolithographic radiation 6. The equipment 1 further includes a photomask substrate 10 having on its surface 12 a photolithographic pattern 14. The photomask comprises substrate 10 and photolithographic pattern 14.

To protect the photomask, a pellicle comprising pellicle frame 16 and pellicle membrane 20 is positioned a certain distance over the photomask. Pellicle frame 16 is typically a single-walled frame of metal, metal alloy, or plastic. Pellicle membrane 20 is typically securely fastened to pellicle frame 16 via an adhesive or adhesive tape (not shown).

A pellicle may be secured to a photomask to protect it from particles within the photolithography area. Photolithography is done in an ambient environment where particles are usually present, even in the cleanest of clean-room environments. Cleaning particles from the photomask can be difficult because of the relatively tight spacing between the photomask and the pellicle membrane. To properly clean a photomask and its pellicle often requires that they be removed from the photolithography area to the mask shop for several hours or even days, at a significant expenditure of production resources, and the production of semiconductors can possibly be delayed.

The line dimensions of semiconductor devices are constantly shrinking. In order to achieve smaller patterning dimensions, photolithography must be carried out at increasingly shorter wavelengths. However, organic pellicle membranes typically cannot be used for shorter wavelengths. The high energy of the photons absorbed by the pellicle membrane can cause a chemical reaction in or near the pellicle membrane, causing it to deteriorate. Further, at wavelengths of approximately 200 nanometers (nm) and below a reaction occurs between the radiation and the air between the photomask and the pellicle membrane, producing ozone, which can break down organic pellicle membranes. In some instances, the pellicle membrane becomes physically damaged during only one exposure to the radiation.

For the reasons stated above, and for other reasons stated below which will become apparent to those skilled in the art upon reading and understanding the present specification, there is a significant need in the art for a pellicle device that can readily be removed and reattached without costly or complicated procedures such as cleaning, adhesive application, and so forth, as well as for methods of operating such a pellicle device.

DETAILED DESCRIPTION OF EMBODIMENTS OF THE INVENTION

In the following detailed description of embodiments of the invention, reference is made to the accompanying drawings which form a part hereof, and in which is shown by way of illustration specific preferred embodiments in which the subject matter may be practiced. These embodiments are described in sufficient detail to enable those skilled in the art to practice them, and it is to be understood that other embodiments may be utilized and that architectural, optical, compositional, mechanical, and electrical changes may be made without deporting from the spirit end scope of the present subject matter. The following detailed description is, therefore, not to be taken in a limiting sense, and the scope of embodiments of the present invention is defined only by the appended claims.

The present subject matter provides a solution to the problem of providing quick and easy access to the photomask and pellicle for any of a variety of purposes, such as cleaning and replacing the pellicle membrane, exposing the photomask to photolithographic radiation, cleaning the photomask surface, and so forth.

The present subject matter provides a solution to the problem of pellicle membrane deterioration to radiation beyond the visible light spectrum, such as ultraviolet, deep ultraviolet, extreme ultraviolet, X-ray, electron beam, ion beam, and the like. The range being used and being evaluated by current semiconductor photolithography is in the range of 2 to 200 nm, but embodiments of the invention are not limited to such range.

Although the present subject matter has particular utility in photolithographic equipment in which the photolithographic radiation is outside the visible light spectrum, it could also be employed with equipment in which the photolithographic radiation is in the visible light spectrum, particularly to provide ready access to the photomask and pellicle.

Various embodiments are illustrated and described herein. In one embodiment, a two-part pellicle assembly is used, in which an upper member or frame, to which the pellicle sheet is coupled, can be removed from a lower member that is aligned with the photomask substrate. To secure the upper and lower members in proper alignment, various techniques can be used, including magnetic force, mating elements such as mating bevels, male/female couplers, and the like. Methods of using a pellicle are also described.

The present subject matter, as implemented in various embodiments, provides protection of photomasks at the exposure wavelengths mentioned earlier. In addition, for photolithographic exposure using non-damaging radiation, it provides ready access to the photomask and pellicle sheet for cleaning, replacement, or other purposes.

Figure 1:
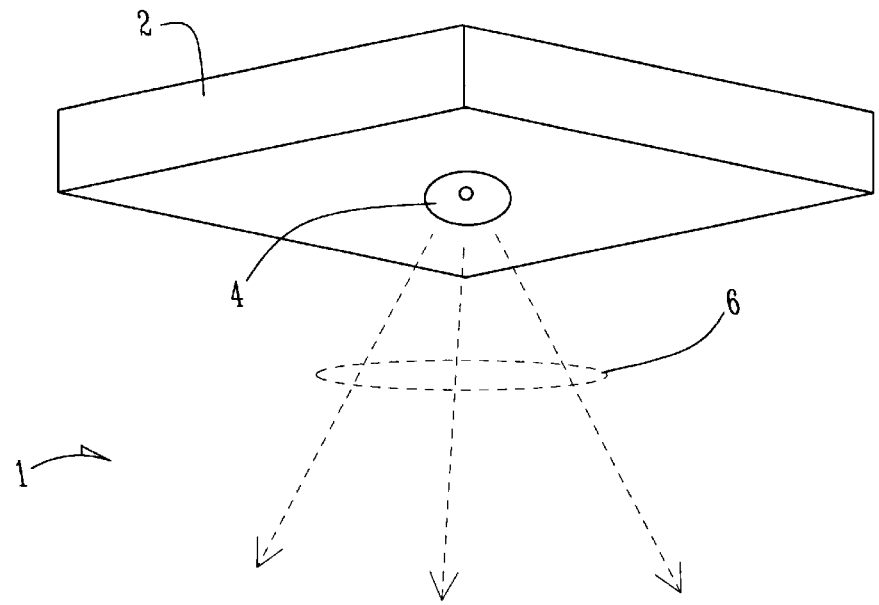
FIG. 1 illustrates a perspective view of prior art semiconductor photolithography equipment, including a prior art pellicle.
Figure 1:
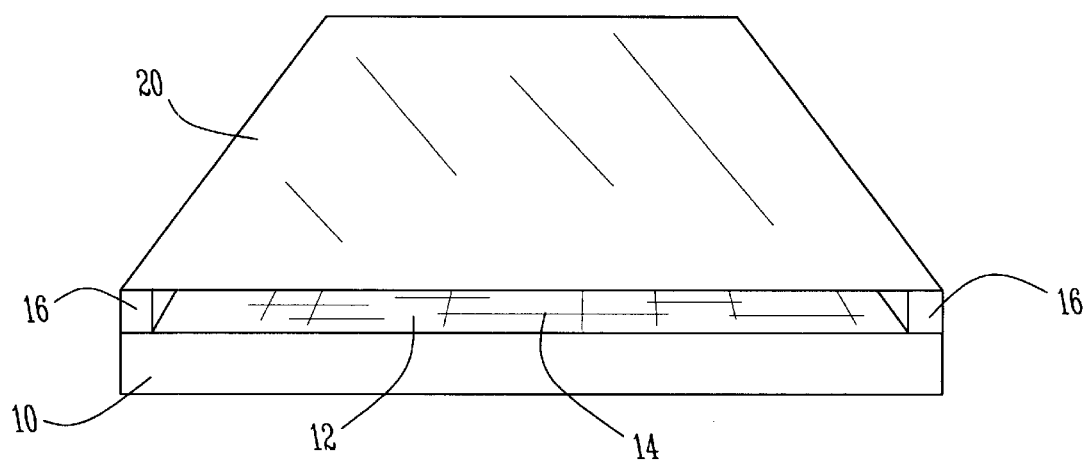
Figure 2:
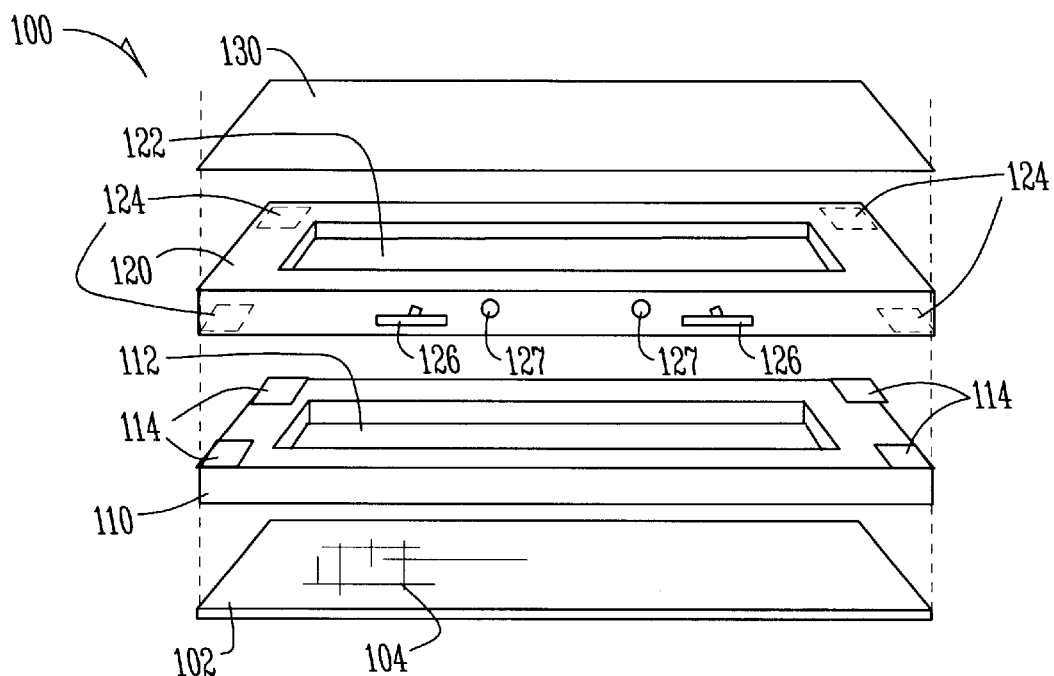
FIG. 2 illustrates a perspective view of photolithographic equipment in accordance with one embodiment of the invention.

FIG. 2 illustrates a perspective view of photolithographic equipment 100 in accordance with one embodiment of the invention. Photolithographic equipment 100 comprises photomask 102 having photolithographic pattern 104. The equipment 100 also includes an illumination optical system (not shown) that can be similar to that shown in FIG. 1.

Photolithographic equipment 100 further comprises a lower member or base member 110 aligned with photomask 102. Base member 110 is normally affixed to photomask 102; however, base member 110 can merely be aligned with photomask 102. Base member 110 comprises a central opening 112. In one embodiment, base member 110 further comprises a suitable securing mechanism, e.g. magnetic material or magnets 114, for securing base member 110 to pellicle frame 120. Although magnets 114 are depicted as located at the upper surface of the corners of base member 110, in other embodiments magnets 114 could be located below the surface and/or at locations other than at the corners of base member 110.

Although photomask base member 110 is depicted as relatively thick, it could be relatively thin. Also, although base member 110 is depicted above photomask 102, in another embodiment it could be located below photomask 102. Photomask base member 110 can comprise other photolithography equipment in addition to the photomask 102.

Photolithographic equipment 100 additionally comprises an upper member in the form of pellicle frame 120. Pellicle frame 120 comprises a central opening 122 that can be of equivalent dimensions to central opening 112 of base member 110. Pellicle frame 120 comprises a suitable securing mechanism for securing it to base member 110. In the embodiment shown in FIG. 2, pellicle frame 120 comprises magnets 124 arranged so their poles are of opposite magnetic polarity to adjoining poles of magnets 114. Although magnets 124 are depicted as located at the lower surface of the corners of pellicle frame 120, in other embodiments magnets 124 could be located above the surface and/or at locations other than at the corners of pellicle frame 120.

In the embodiment depicted in FIG. 2, pellicle frame 120 comprises one or more handling elements, such as handles 126. A purpose of the handling elements is to permit pellicle frame 120 to be positioned against base member 110 or to be removed from base member 110. Pellicle frame 120 can, if desired, also comprise vent holes 127; alternatively or concurrently, base member 110 can comprise vent holes (not shown).

Photolithographic equipment 100 also comprises a pellicle sheet or membrane 130 that is affixed to pellicle frame 120. While pellicle sheet 130 is depicted in FIG. 2 as affixed to the upper surface of pellicle frame 120, it could alternatively be affixed to the lower surface, or it could be held within the central opening 122 of pellicle frame 120.

Pellicle sheet 130 can be of any type of material, such as those mentioned earlier. Pellicle sheet 130 can be opaque, transparent, or it can comprise a combination of opaque and transparent portions. The terms "opaque" and "transparent" can be relative to either or both the exposure (i.e. lithographic) wavelength and an inspection wavelength. Typically an inspection wavelength is in the visible range, but for the present subject matter it is not limited to such range. In one embodiment, pellicle sheet 130 comprises a transparent portion (not shown), e.g. of quartz, plexiglass, a polymeric film, or oilier suitable material, that is commensurate in size with photomask pattern 104, and pellicle sheet 130 is kept in place during inspection using visible radiation but is removed during exposure to photolithographic radiation.

Pellicle sheet 130 is formed of a non-particulating material. In addition to those materials mentioned above, pellicle sheet 130 could be formed of any other type of non-particulating material such as a metal, a metal alloy, or plastic. Pellicle sheet 130 can cover the entire photomask 102, or it can cover just the photomask pattern 104.

Pellicle frame 120 can readily be separated from the photomask base member 110 in order to remove pellicle sheet 130 from the path of photolithographic radiation during exposure of photomask 102, or to inspect, repair, or replace pellicle sheet 130 and/or photomask 102. Pellicle frame 120 is movable from a first position in which pellicle frame 120 is coupled to and overlies photomask base member 110, and a second position wherein pellicle frame 120 is not coupled to and does not overlie photomask base member 110.

Although pellicle frame 120 is depicted in FIG. 2 as being rectangular, in other embodiments pellicle frame 120 can take the form of a different polygon (including a polygon having sides of unequal lengths), a circle, an ellipse, or a free-form geometrical shape.

An advantage that the pellicle frame 120 has over prior art pellicle arrangements is that pellicle frame 120 and pellicle sheet 130 can be readily removed and replaced without having to forcibly remove the pellicle from the photomask and then clean and possibly repair the photomask. Also, pellicle frame 120 and pellicle sheet 130 can be readily removed to provide quick access to photomask 102 for any purpose.

Figure 3:
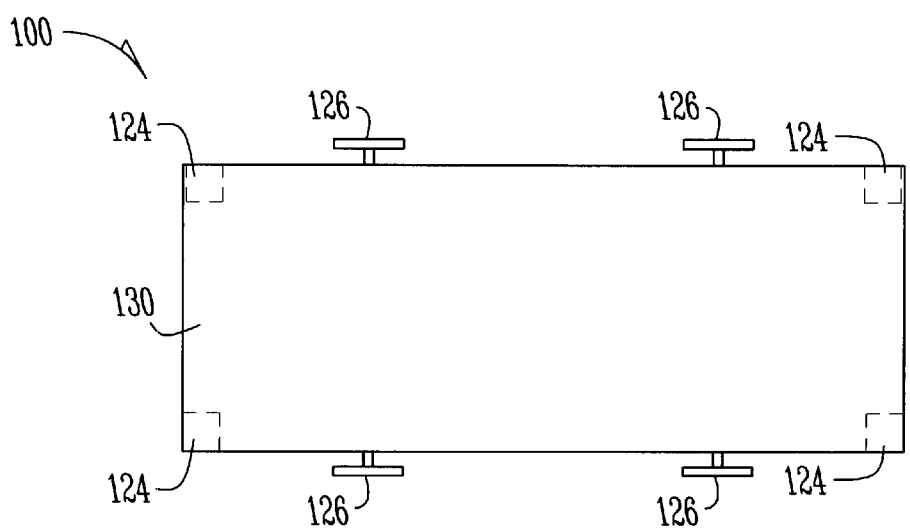
FIG. 3 illustrates a top view of the photolithographic equipment shown in FIG. 2.

FIG. 3 illustrates a top view of the photolithographic equipment 100 shown in FIG. 2. Pellicle sheet 130 is affixed to the top of pellicle frame 120 (FIG. 2). Any suitable mechanism for affixing pellicle sheet 130 to pellicle frame 120 can be used, such as an adhesive, clips, or the like. The pellicle frame 120 provides support for handles 126 and alignment magnets 124.

Figure 4:
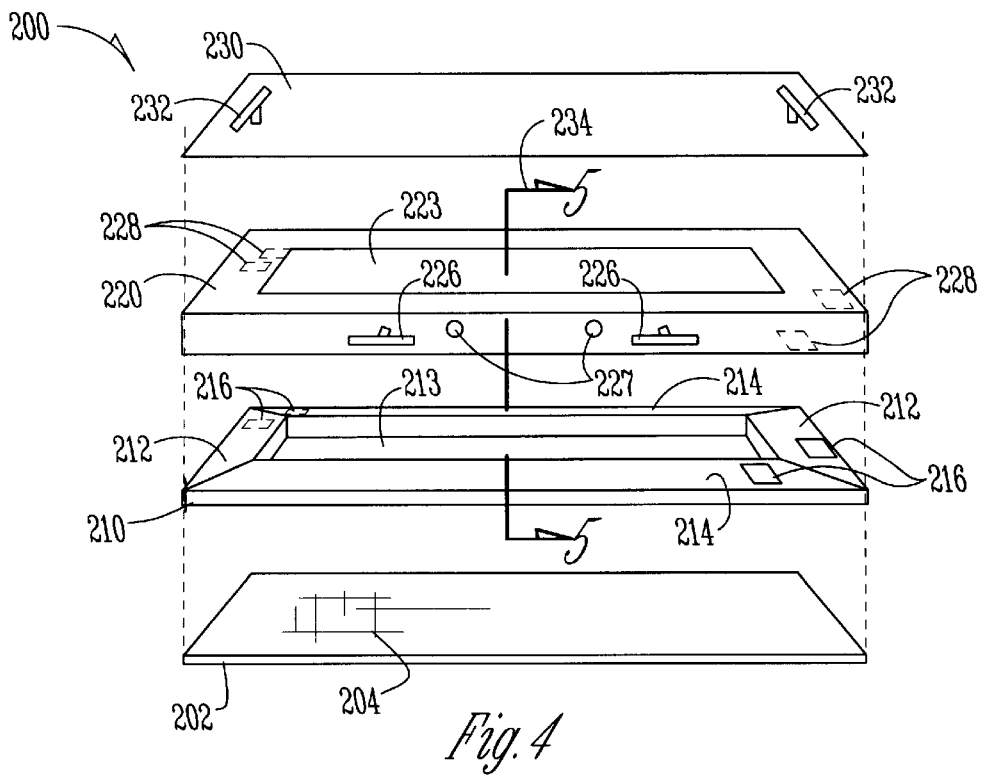
FIG. 4 illustrates a perspective view of photolithographic equipment in accordance with an embodiment of the invention.

FIG. 4 illustrates a perspective view of photolithographic equipment 200 in accordance with an embodiment of the invention. Photolithographic equipment 200 comprises photomask 202 having photolithographic pattern 204.

Photolithographic equipment 200 further comprises a lower member or base member 210 aligned with photomask 202. Base member 210 is normally affixed to photomask 202; however, base member 210 can merely be aligned with photomask 202. Base member 210 comprises a central opening 213. In one embodiment, base member 210 further comprises a suitable securing mechanism, e.g. magnetic material or magnets 216, for securing base member 210 to pellicle frame 220. Although magnets 216 are depicted as located at the upper surface of only two corners of base member 210, in other embodiments magnets 216 could be located at all four corners, or below the surface and/or at locations other than at the corners of base member 210.

Although photomask 202 is illustrated in FIG. 4 as lying beneath base member 210, in other embodiments, it could be positioned on the upper surface of base member 210 or suitably secured within central opening 213 of base member 210.

Photolithographic equipment 200 additionally comprises an upper member in the form of pellicle frame 220. Pellicle frame 220 comprises a central opening 223 that can be of equivalent dimensions to central opening 213 of base member 210. Pellicle frame 220 comprises a suitable securing mechanism for securing it to base member 210. In the embodiment shown in FIG. 4, pellicle frame 220 comprises magnets 228 arranged so their poles are of opposite magnetic polarity to adjoining poles of magnets 216. Although magnets 228 are depicted as located at the lower surface of only two corners of pellicle frame 220, in other embodiments magnets 228 could be located at all four corners, or above the surface and/or at locations other than at the corners of pellicle frame 220.

Figure 5:
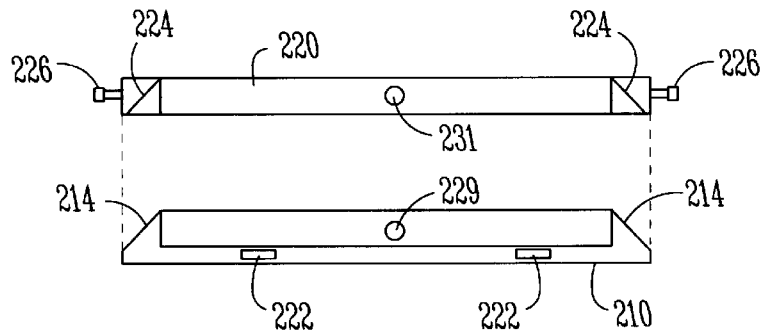
FIG. 5 illustrates a cross-section of a portion of the photolithographic equipment shown in FIG. 4 taken along line 234.

In the embodiment depicted in FIG. 4, pellicle frame 220 comprises one or more handling elements, such as handles 226. A purpose of the handling elements is to permit pellicle frame 220 to be positioned against base member 210 or to be removed from base member 210. Pellicle frame 220 can, if desired, also comprise vent holes 227; alternatively or concurrently, base member 210 can comprise vent holes, such as vent hole 229 (FIG. 5).

Photolithographic equipment 200 also comprises a pellicle sheet or membrane 230 that is affixed to pellicle frame 220. While pellicle sheet 230 is depicted in FIG. 4 as affixed to the upper surface of pellicle frame 220, it could alternatively be affixed to the lower surface, or it could be held within the central opening 223 of pellicle frame 220. Pellicle sheet 230 can be of any type of material, such as those mentioned earlier. In the embodiment shown in FIG. 4, pellicle sheet 230 includes a pair of handling elements, such as handles 232; however, in other embodiments, handles 232 can be omitted.

An advantage that the pellicle frame 220 has over prior art pellicle arrangements is that pellicle frame 220 and pellicle sheet 230 can be readily removed and replaced without having to forcibly remove the pellicle from the photomask and then clean and possibly repair the photomask. Also, pellicle frame 220 and pellicle sheet 230 can be readily removed to provide quick access to photomask 202 for any purpose.

Base member 210 and pellicle frame 220 can be aligned with one another, and pellicle frame 220 can be secured to base member 210, through mating elements such as mating bevels. The upper surfaces 212 of the ends of base member 210 are beveled from central opening 213 towards the outer edge of base member 210, and the upper surfaces 214 of the sides of base member 210 are also beveled from central opening 213 towards the outer edge of base member 210. Likewise, a matching bevel is provided on pellicle frame 220. This is better seen in FIG. 5, now to be discussed.

FIG. 5 illustrates a cross-section of a portion of the photolithographic equipment shown in FIG. 4 taken along line 234. The upper surfaces 214 of the sides of base member 210 are beveled towards the outer edge of base member 210. Surfaces 214 of base member 210 mate with the lower surfaces 224 of the sides of pellicle frame 220.

Also illustrated in FIG. 5 are vent holes 229 and 231 in base member 210 and pellicle frame 220, respectively. Vent holes 229 and 231 are aligned when pellicle frame 220 is positioned on top of base member 210.

Base member 210 comprises recesses or indentations 222, which can be used to remove base member 210 from photomask 202 (FIG. 4) or to hold base member 210 while pellicle frame 220 is removed from base member 210. Indentations 222 could be omitted; alternatively, more indentations 222 could be used on base member 210 and/or on pellicle frame 220.

Figure 6:
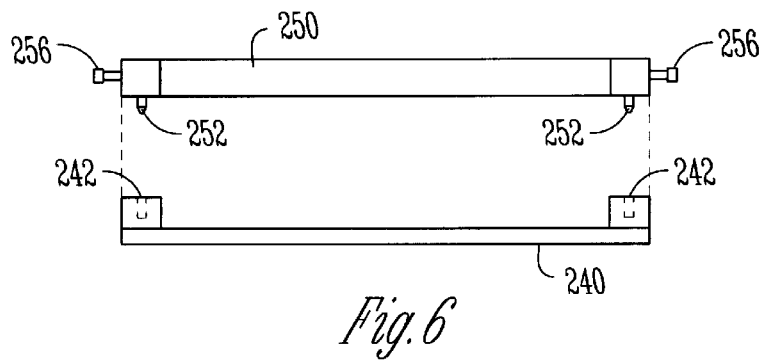
FIG. 6 illustrates a cross-section of an alternative embodiment of photolithographic equipment.

FIG. 6 illustrates a cross-section of an alternative embodiment of photolithographic equipment. A base member 240 comprises female members, such as holes 242, in its upper surface. A pellicle frame 250 comprises male members, such as protrusions 252, in its lower surface. Protrusions 252 and holes 242 provide an alternative type of securing mechanism to secure and align pellicle frame 250 with respect to base member 240. Pellicle frame 250 further comprises handling elements in the form of handles 256. Other handling elements could be substituted for handles 256.

Figure 7:
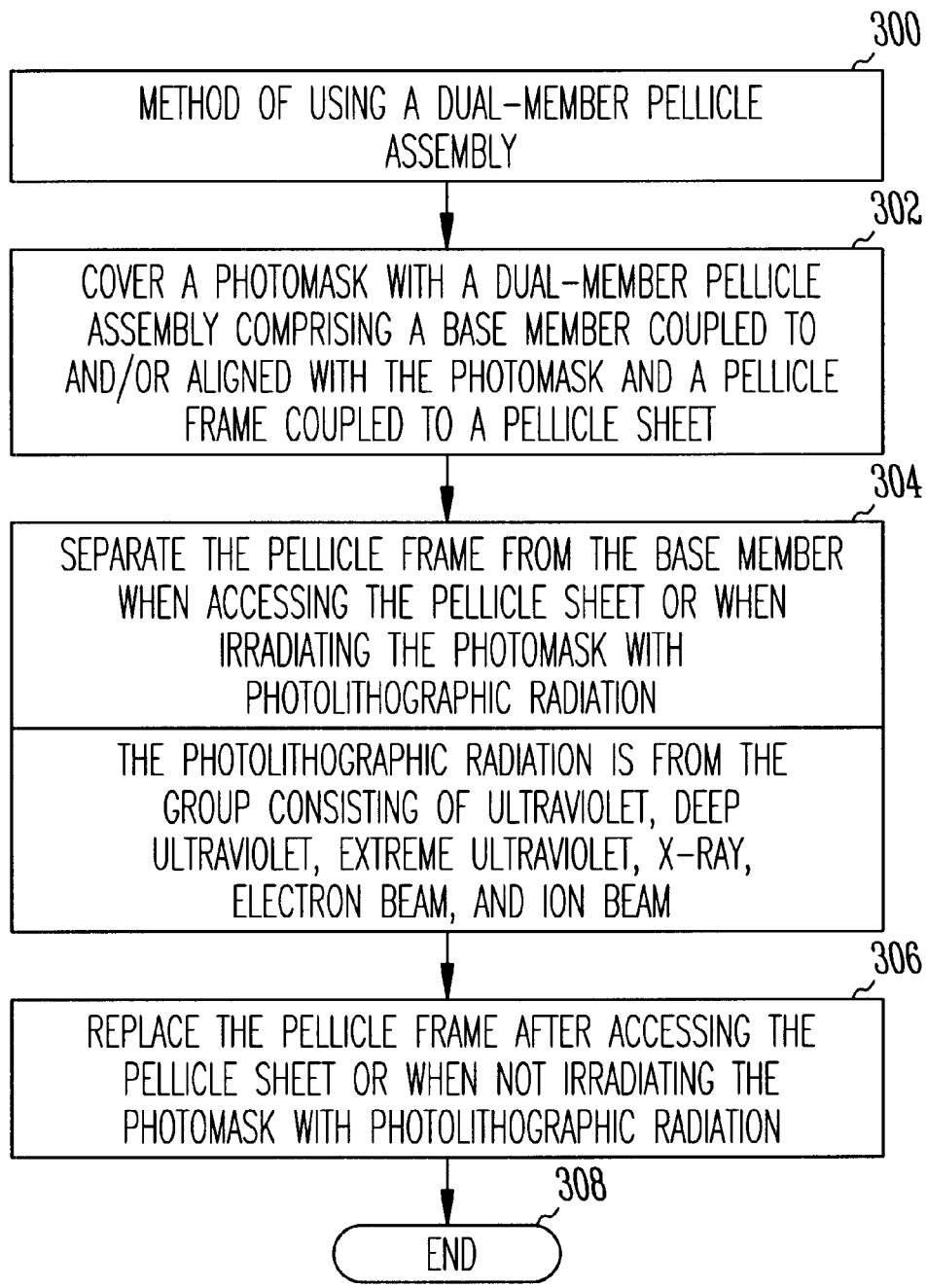
FIG. 7 illustrates a flow diagram of a method of using a dual-member pellicle assembly, in accordance with one embodiment of the invention.

FIG. 7 illustrates a flow diagram of a method 300 of using a dual-member pellicle assembly, in accordance with one embodiment of the invention.

In 302, a photomask is covered with a dual-member pellicle assembly that comprises a base member coupled to and/or aligned with the photomask and a pellicle frame coupled to a pellicle sheet.

In 304, the pellicle frame is separated from the base member when accessing the pellicle sheet (e.g. to clean or replace it) or when irradiating the photomask with photolithographic radiation. The photolithographic radiation is from the group consisting of ultraviolet, deep ultraviolet, extreme ultraviolet, X-ray, electron beam, and ion beam radiation. In addition, or alternatively, to removing the pellicle frame when accessing the pellicle sheet or during exposure of photomask, the pellicle frame can be removed when it is desired to access the photomask or any elements associated therewith, such as for the purpose of cleaning or inspecting the photomask or for other purposes.

In 306, the pellicle frame is replaced after accessing the pellicle sheet or when the photomask is not being irradiated with photolithographic radiation.

Although FIG. 7 depicts the method ending in 308, it will be understood that the method can be indefinitely repeated.

CONCLUSION

The present subject matter provides for apparatus and methods that permit the use of pellicles for photolithographic operations using high-energy short-wavelength radiation and/or radiation beyond the visible light spectrum. By employing a removable pellicle, the pellicle is not damaged by the photolithographic radiation. In addition, the pellicle can readily be removed when it is necessary to access the pellicle and/or photomask for any purpose, such as to clean or replace the pellicle sheet. As a result, the subject matter reduces semiconductor production costs and enables semiconductors to be marketed more competitively and with higher quality than with known apparatus and methods for performing semiconductor photolithography.

As shown herein, the present subject matter can be implemented in a number of different embodiments, including but not limited to a pellicle device, a pellicle frame, and various methods for using a pellicle. Other embodiments will be readily apparent to those of ordinary skill in the art.

The architecture, optics, composition, materials, dimensions, and sequence of operations can all be varied to suit particular requirements of semiconductor photolithographic environments.

The various elements depicted in the drawings are merely representational and are not drawn to scale. Certain proportions thereof may be exaggerated, while others may be minimized. The drawings are intended to illustrate various implementations of the subject matter, which can be understood and appropriately carried out by those of ordinary skill in the art.

Although specific embodiments have been illustrated and described herein, it will be appreciated by those of ordinary skill in the art that any arrangement that is calculated to achieve the same purpose may be substituted for the specific embodiment shown. This application is intended to cover any adaptations & variations of the present invention. Therefore, it is manifestly intended that embodiments of this invention be limited only by the claims and the equivalents thereof.

What is claimed is:

1. A pellicle device comprising:
   a first member aligned with a photomask;
   a second member movable relative to the first member;
   a handling element; and
   a pellicle sheet coupled to the second member, wherein the pellicle sheet is movable, using the handling element, between a first position in which the pellicle sheet overlies the first member and a second position wherein the pellicle sheet does not overlie the first member.

2. The pellicle device of claim 1, wherein the pellicle sheet is opaque to photolithographic radiation.

3. The pellicle device of claim 1, wherein a portion of the pellicle sheet is transparent to inspection radiation.

4. The pellicle device of claim 1, wherein the second member comprises the handling element.

5. The pellicle device of claim 1, wherein the pellicle sheet comprises the handling element.

6. The pellicle device of claim 1 and further comprising a securing mechanism to secure the second member with respect to the first member.

7. The pellicle device of claim 6, wherein the securing mechanism comprises magnetic material.

8. The pellicle device of claim 7, wherein the securing mechanism comprises oppositely polarized magnets on the first member and second member.

9. The pellicle device of claim 6, wherein the securing mechanism comprises mating members on the first member and the second member.

10. The pellicle device of claim 6, wherein the securing mechanism comprises mating bevels on the first member and the second member.

11. The pellicle device of claim 1, wherein the pellicle sheet comprises material that would be damaged by exposure to photolithographic radiation.

12. A pellicle frame to cover a photomask comprising:
    a frame element comprising a handling element; and
    a pellicle sheet coupled to the frame element, wherein the pellicle sheet is opaque to photolithographic radiation, and wherein the frame element is movable, using the handling element, between a first position in which the pellicle sheet overlies the photomask and a second position wherein the pellicle sheet does not overlie the photomask.

13. The pellicle frame of claim 12, wherein the pellicle sheet comprises material that would be damaged by exposure to photolithographic radiation.

14. The pellicle frame of claim 12, wherein a portion of the pellicle sheet is transparent to inspection radiation.

15. The pellicle frame of claim 12, wherein the pellicle sheet comprises the handling element.

16. The pellicle frame of claim 12, wherein the frame element comprises a securing mechanism to secure the pellicle frame to a photomask.

17. The pellicle frame of claim 16, wherein the securing mechanism comprises magnetic material.

18. The pellicle frame of claim 17, wherein the securing mechanism comprises a magnet.

19. The pellicle frame of claim 16, wherein the securing mechanism comprises a bevel on the frame member.

20. The pellicle frame of claim 16, wherein the securing mechanism comprises one or more mating members on the frame member.

21. A method comprising:
    protecting a photomask with a pellicle, the pellicle comprising a handling element; and
    removing the pellicle, using the handling element, when irradiating the photomask with photolithographic radiation.

22. The method recited in claim 21, wherein the photolithographic radiation is of a type that would physically damage the pellicle if it were exposed to such radiation.

23. The method recited in claim 21, wherein the photolithographic radiation is outside the visible light spectrum.

24. The method recited in claim 21, wherein the wavelength of the photolithographic radiation is within the range of 2 to 200 nanometers.

25. The method recited in claim 21, wherein the photolithographic radiation is from the group consisting of ultraviolet, deep ultraviolet, extreme ultraviolet, X-ray, electron beam, and ion beam.

26. The method recited in claim 21 and further comprising:
    replacing the pellicle, using the handling element, when not irradiating the photomask with photolithographic radiation.

27. The method recited in claim 21 and further comprising:
    when not irradiating the photomask with photolithographic radiation, securing the pellicle to the photomask.

28. The method recited in claim 27, wherein securing comprises using magnetic material.

29. The method recited in claim 27, wherein securing comprises using oppositely polarized magnets on the pellicle and photomask.

30. The method recited in claim 27, wherein securing comprises using mating bevels on the pellicle and photomask.

31. The method recited in claim 27, wherein securing comprises using mating members on the pellicle and photomask.

* * * * *